(12) United States Patent
Marchione et al.

(10) Patent No.: US 10,393,271 B2
(45) Date of Patent: Aug. 27, 2019

(54) METHOD FOR MANUFACTURING SEALS

(71) Applicant: Caterpillar Inc., Peoria, IL (US)

(72) Inventors: Thierry Marchione, Herber City, UT (US); Timothy A. Thorson, Morton, IL (US); Dennis Michael Turczyn, Edelstein, IL (US); Zachary Steven Birky, Washington, IL (US)

(73) Assignee: Caterpillar Inc., Deerfield, IL (US)

( * ) Notice: Subject to any disclaimer, the term of this patent is extended or adjusted under 35 U.S.C. 154(b) by 25 days.

(21) Appl. No.: 15/635,625

(22) Filed: Jun. 28, 2017

(65) Prior Publication Data
US 2019/0003596 A1    Jan. 3, 2019

(51) Int. Cl.
| | |
|---|---|
| *F16J 15/34* | (2006.01) |
| *C23C 4/08* | (2016.01) |
| *C23C 4/129* | (2016.01) |
| *C23C 4/18* | (2006.01) |
| *C23C 14/58* | (2006.01) |
| *C23C 14/16* | (2006.01) |
| *B33Y 80/00* | (2015.01) |
| *B33Y 10/00* | (2015.01) |
| *B22F 3/105* | (2006.01) |

(52) U.S. Cl.
CPC .......... *F16J 15/3496* (2013.01); *B33Y 80/00* (2014.12); *C23C 4/08* (2013.01); *C23C 4/129* (2016.01); *C23C 4/18* (2013.01); *C23C 14/16* (2013.01); *C23C 14/5813* (2013.01); *B22F 3/1055* (2013.01); *B33Y 10/00* (2014.12)

(58) Field of Classification Search
CPC ........ F16J 15/34; F16J 15/3436; F16J 15/344; F16J 15/3464; F16J 15/3496; B33Y 80/00; B33Y 10/00; C23C 4/129; C23C 4/08; C23C 4/18; C23C 14/16; C23C 14/5813; B22F 3/1055
See application file for complete search history.

(56) References Cited

U.S. PATENT DOCUMENTS

| | | | |
|---|---|---|---|
| 3,086,782 A * | 4/1963 | Peickii | F16J 15/3496 277/382 |
| 4,824,123 A * | 4/1989 | Chia | E21B 10/25 175/371 |
| 5,405,660 A * | 4/1995 | Psiuk | B23K 35/32 427/597 |
| 5,879,743 A | 3/1999 | Revankar | |
| 9,138,805 B2 | 9/2015 | Wodrich | |
| 2014/0175753 A1 | 6/2014 | Antoine | |

* cited by examiner

*Primary Examiner* — Gilbert Y Lee

(57) ABSTRACT

A method for manufacturing a seal is disclosed. The method includes coating a sealing surface substrate of an annular main seal body of the seal with a layer of Molybdenum, and melting the layer of Molybdenum to fuse the layer of Molybdenum into the sealing surface substrate to form an alloyed outer seal layer. The alloyed outer seal layer forms a sealing surface of the seal.

16 Claims, 4 Drawing Sheets

METHOD FOR MANUFACTURING SEALS

TECHNICAL FIELD

The present disclosure relates to a method for manufacturing seals, and, more particularly, the present disclosure relates to the coating of a layer of Molybdenum onto a sealing surface of the seals.

BACKGROUND

Seals, such as mechanical face seals, including metal seals and rigid seals, are commonly applied in undercarriages of construction machines. For example, seals may be applied in track rollers and chain links of an endless track of the construction machines, to maintain a smooth operation of the endless track. More specifically, such seals are commonly employed to prevent lubricants, such as grease, from leaking from a junction formed by one or more moving components of the endless track.

In operation, such seals may repeatedly slide against surfaces of adjoining components (i.e. there may be metal-to-metal contact), and if such operations were to continue for prolonged periods, friction may be generated between the seal and the adjoining components. A generation of friction may cause seal wear and excessive heat generation, which in turn may increase the chances of seal seizure and damage. Seal seizure and damage may also potentially affect operations of one or more components surrounding the seal.

U.S. Pat. No. 9,138,805 relates to a mechanical face seal rings having a metallurgically bonded wear-resistant coating on the wear surfaces and methods for forming such coated components. The face seal rings, which can be formed of a relatively inexpensive base metal or alloy, have a hard metal alloy slurry disposed on the wear surfaces and then fused to form a metallurgical bond with the iron-based alloy. The wear-resistant coating comprises a fused, metal alloy comprising at least 60% iron, cobalt, nickel, or alloys.

SUMMARY OF THE INVENTION

In one aspect, the disclosure relates to a method for manufacturing a seal. The method includes coating a sealing surface substrate of an annular main seal body of the seal with a layer of Molybdenum, and melting the layer of Molybdenum to fuse the layer of Molybdenum into the sealing surface substrate to form an alloyed outer seal layer. The alloyed outer seal layer forms a sealing surface of the seal.

In another aspect, the disclosure relates to a seal. The seal is manufactured by a process including coating a sealing surface substrate of an annular main seal body of the seal with a layer of Molybdenum, and melting the layer of Molybdenum to fuse the layer of Molybdenum into the sealing surface substrate to form an alloyed outer seal layer. The alloyed outer seal layer forms a sealing surface of the seal.

In yet another aspect, the present disclosure is directed towards a seal. The seal includes a base portion made from a base material, and an alloyed outer seal layer formed from the base material and Molybdenum. The alloyed outer seal layer forms a sealing surface of the seal.

DETAILED DESCRIPTION

Figure 1:
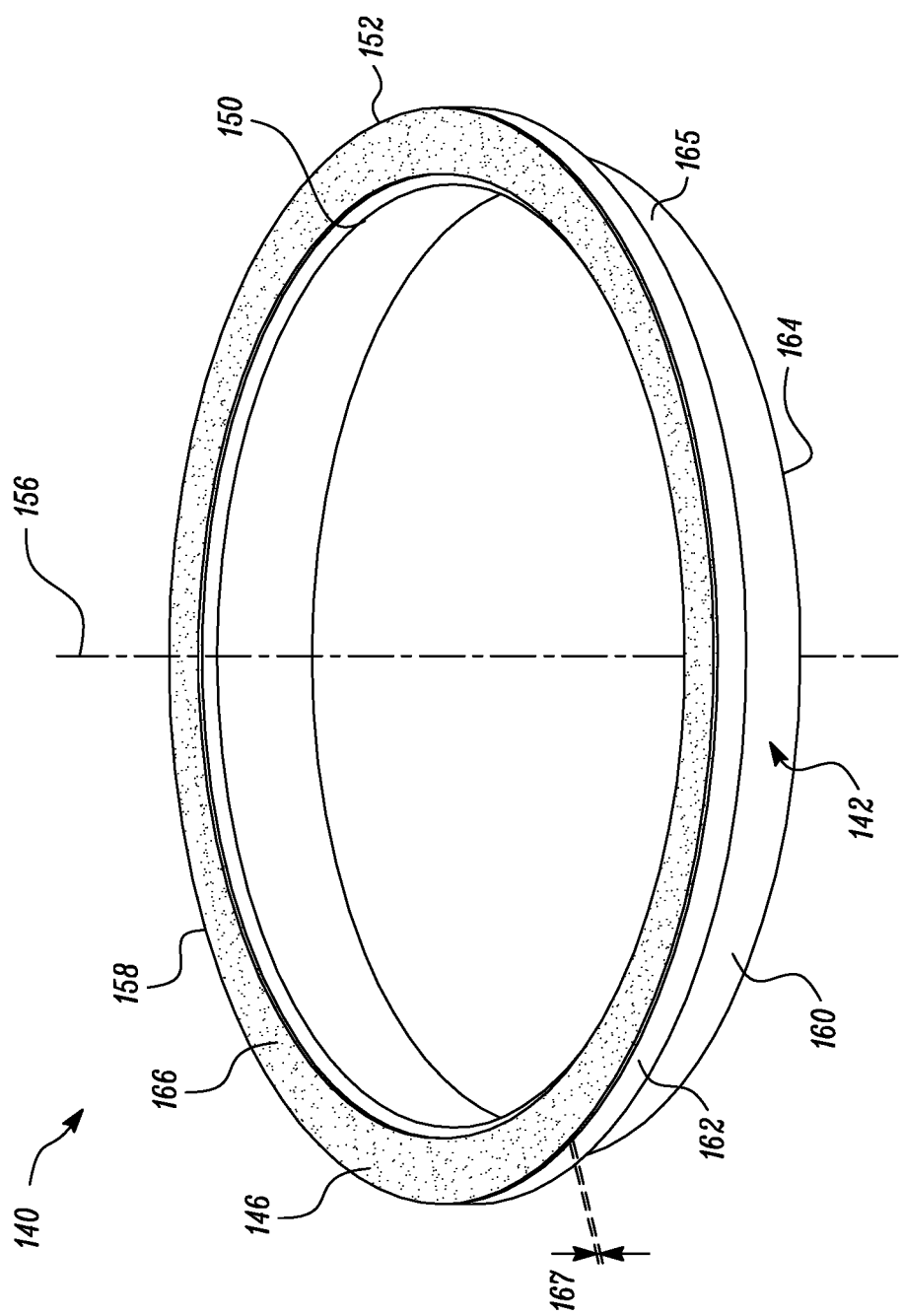
FIG. 1 is an isometric view of an exemplary seal applied within the endless track, in accordance with an aspect of the present disclosure.

Referring to FIG. 1, an exemplary seal 140 is illustrated. The seal 140 may be used in various types of machines such as, for example, track-type machines used for excavating and material moving, mining trucks and other trucks used for hauling, and machines used for excavating, material handling, hauling, farming, forestry, etc. The seal 140 may also be applied in different applications, such as in different components of such machines. For example, in undercarriage rollers, idlers, bogie pins, joint assemblies of an endless track of a work machine, or final drive assemblies of excavators, tractors, off-highway trucks, etc. As further examples, the seal 140 and/or various aspects of the seal 140 discussed in this disclosure, may be used in components including pumps, augers, scrapers, axles, skidders, backhoes shovels, classifiers, ski lifts, tractors, conveyors, transporters, drill rigs, tunneling machines, graders, wagons, haulers, railway equipment, loaders, axles, final drive applications, wheel applications, and similar components. Moreover, aspects of the seal 140, which will be discussed further below, may be applicable to any conventionally available seal as well. In one implementation, the seal 140 may represent a Duo-Cone™ seal, as produced by Caterpillar Inc.

Figure 3:
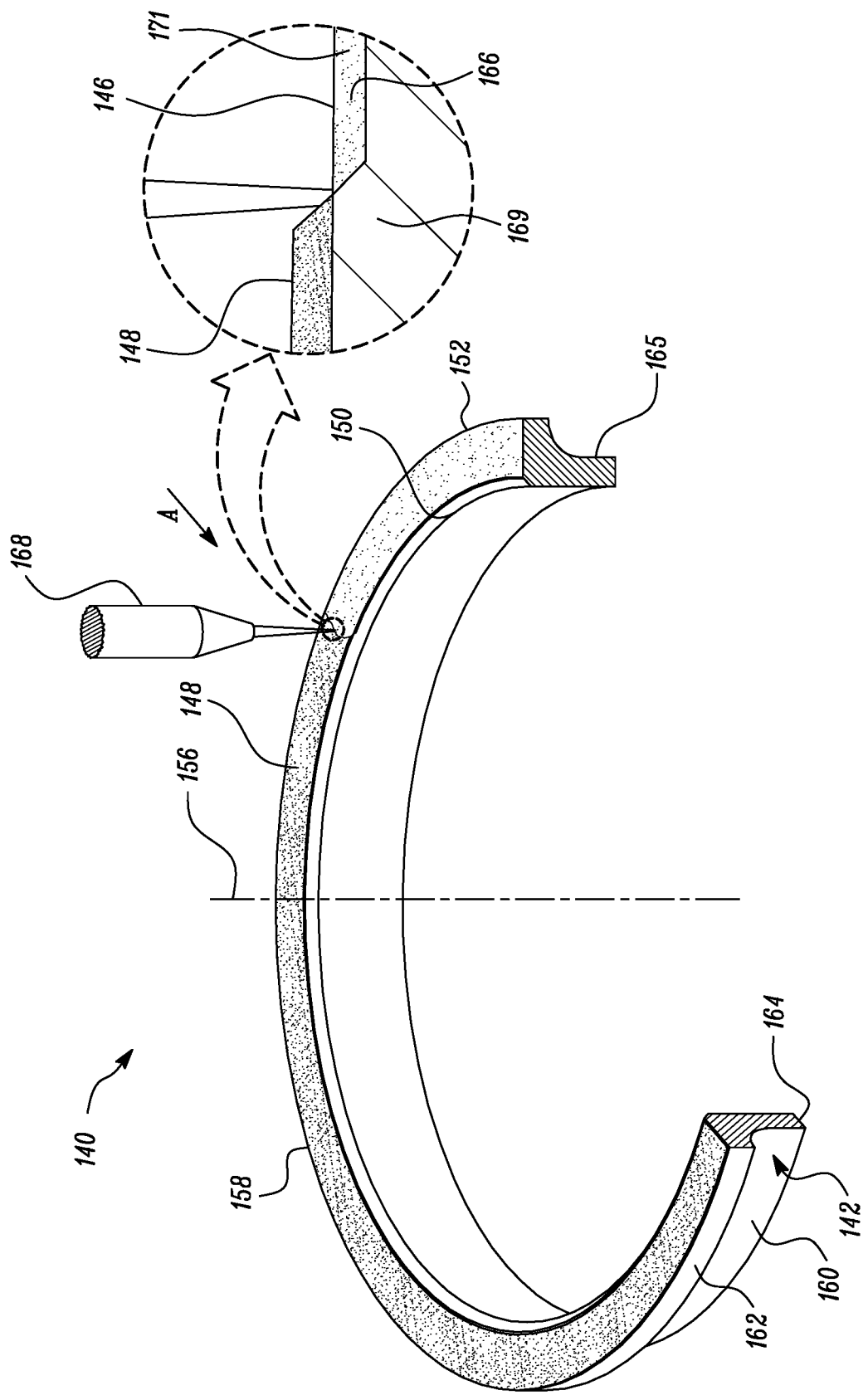

The seal 140 may be annular or ring-shaped. The seal 140 may be a rigid seal, made of metal, and may be of a face-type seal, such as a Heavy Duty Dual Face seal. As illustrated in FIGS. 1 and 3, the seal 140 includes a sealing surface 146 which includes an alloyed outer seal layer 166 as further discussed herein that is configured to interact with, engage, and maintain a sealing interface or engagement with an adjacent, facing component or surface thereof, which the alloyed outer seal layer 166 of the sealing surface 146 contacts. In one embodiment, and depending upon an application, the sealing surface 146 of the seal 140 can be abutted against a sealing surface of another similar seal (not shown), and thus the seal 140 may be part of a seal assembly. The seal 140 can include and can be formed, in part, of an annular main seal body 142 including an inner circumference 150 and an outer circumference 152 defined around a center axis 156 of the seal 140. The seal 140, and annular main seal body 142 thereof, can extend axially about the center axis 156 from a first outer axial end 164 to a second outer axial end, defined as a sealing end 158 of the seal 140.

Figure 2:
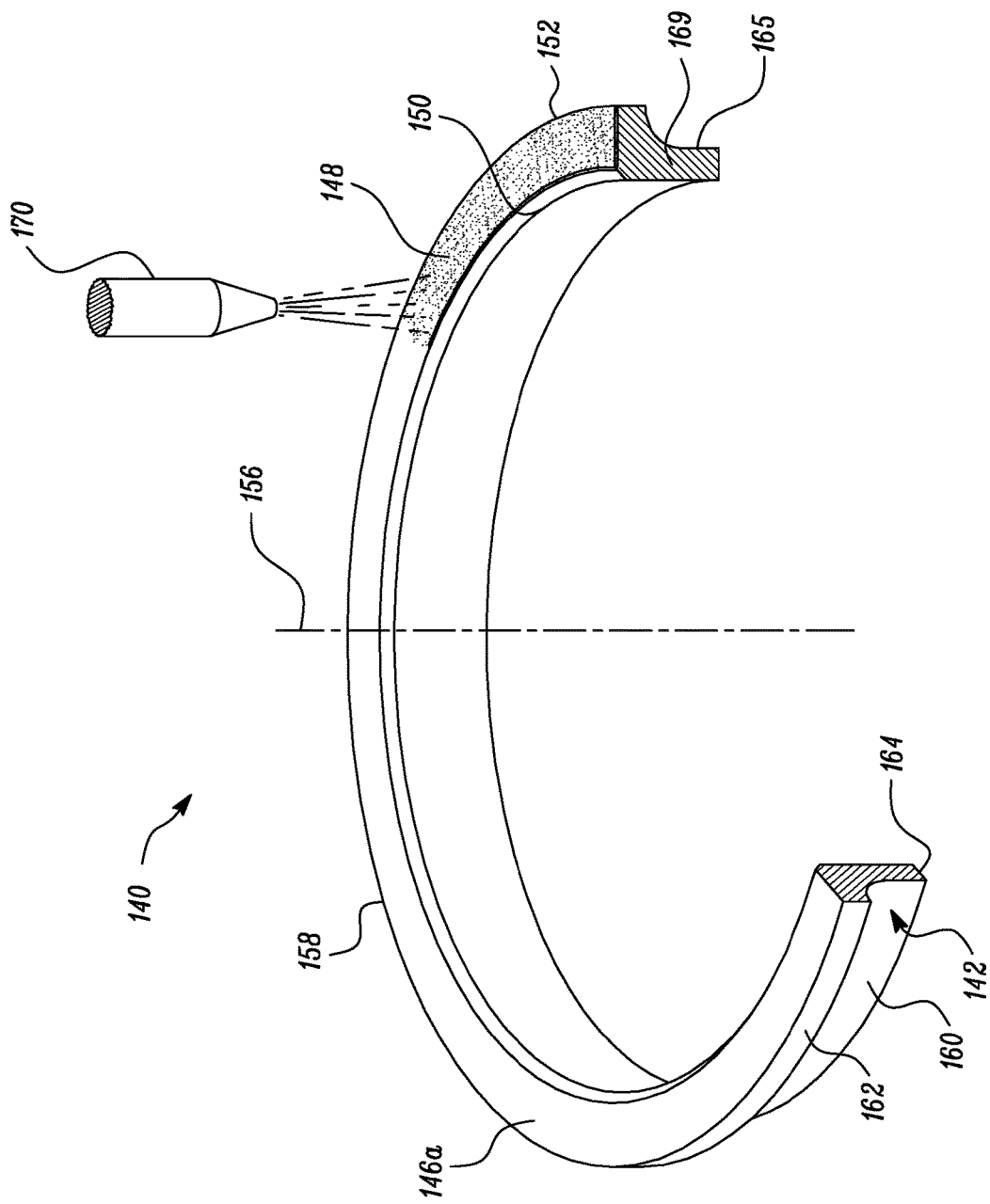
FIGS. 2 and 3 depict processes involved with a formation of an alloyed outer seal layer on an annular main seal body of the seal, in accordance with an aspect of the present disclosure.

The annular main seal body 142 can be defined as a substantially solid, unitary body, which includes a first section 160 and a second section 162. In one embodiment, as shown in FIGS. 1-3, the first section 160 can extend axially and in axial alignment with the center axis 156 from the first outer axial end 164 to the second section 162, and the second section 162 can extend laterally or radially outward from the axially-extending first section 160 and the center axis 156, to define the seal 140 and the annular main seal body 142 thereof as including a substantially "L" shaped cross-sectional profile, as shown in FIGS. 2 and 3. In addition, the radial cross-sectional profile, of the second section 162 of the annular main seal body 142 can extend axially outward from the first section 160 to the radiallyextending sealing surface 146 which can define, in part, the sealing end 158 of the formed seal 140. For the purposes of the present disclosure, the "substantially 'L' shaped cross-sectional profile" of the annular main seal body 142 as defined by the first section 160 and the second section 162 means an angle between the first section 160 and the second section 162 of 90°, or proximate to 90° in a value range of between 90° to 110°. Furthermore, the sealing surface 146 can be a substantially flat surface, and for the purposes of the present disclosure, the "substantially flat surface" of the sealing surface 146 (as well as the alloyed outer seal layer 166 thereof) means that at least an outer radial portion of the sealing surface 146 (as well as the alloyed outer seal layer 166 thereof) directly adjacent to and including and/or defining the outer circumference 152 of the seal 140 is a surface which extends uniformly along a plane oriented orthogonally, or at a 90° angle with respect to the center axis 156.

As discussed above and as further disclosed herein, the seal 140 can include the annular main seal body 142 which can be defined as a first: or base portion 165 of the seal 140, and additionally the seal 140 can include a second portion defined as the alloyed outer seal layer 166. The annular main seal body 142, which, as above, can be defined as the base portion 165 of the seal 140, is composed of, and fabricated from a first or base material 169, wherein the base material 169 can be a solid, hard, and/or durable material that may have high compressive strength, as well as any one or more other properties as disclosed according to any one or more embodiments herein. In one embodiment, the base material 169 is a metal, such as any one or more of the different types (or grades) of steel or other metals. In one embodiment, the type of steel or the other metals may be selected based on certain desired physical properties of the seal 140. Such properties may include hardness, toughness, wear resistance, etc., of the seal 140. In one embodiment, the base material 169 from which the annular main seal body 142 is made is one of C6 white iron or low carbon steel. Alternatively, the annular main seal body 142 of the seal 140 may also be manufactured from C6 nickel alloy, stellite iron alloy, Ni-Hard iron alloy, SAE 52100 steel, and/or SAE 1074 steel. The base material 169 may further be selected based on a number of other factors, including any one or more of material cost, machinability, and bondability with one or more material(s) (for example, Molybdenum in this case) that facilitates formation of the alloyed outer seal layer 166.

As further disclosed herein, the alloyed outer seal layer 166 defining the second portion of the seal 140 is formed on a sealing surface substrate 146a of the annular main seal body 142 via in part, a coating process such that the alloyed outer seal layer 166 forms the outer, sealing surface 146 at the sealing end 158 of the seal 140 such that the sealing surface 146 of the alloyed outer seal layer 166 defines a seal face of the seal 140 configured to interact with, engage, and maintain a sealing interface or engagement with an adjacent, facing component, or surface thereof which the sealing surface 146 of the alloyed outer seal layer 166 of the seal 140 contacts. As discussed above and as further disclosed herein, the alloyed outer seal layer 166 which forms the sealing surface 146 can be composed of an alloyed material 171 which is composed of and formed from the base material 169 of the sealing surface substrate 146a and Molybdenum. The coating and resultant alloyed material 171 of which the alloyed outer seal layer 166 is formed is configured to provide increased hardness and/or wear resistance to the sealing surface 146 of the seal 140. In one embodiment, the alloyed outer seal layer 166 has a thickness 167 that ranges between 100 microns to 500 microns. Additionally, a percentage of Molybdenum in the alloyed material 171 of which the alloyed outer seal layer 166 is formed (i.e. relative to the total material (base material 169, Molybdenum) of the alloyed material 171 of which the alloyed outer seal layer 166 is formed) is between 10% to 20%. The remaining percentage may be covered by the base material 169.

The seal 140, as well as the elements, features, and components thereof, can be manufactured via any or more of the processes and steps according to any one or more of the embodiments, as disclosed herein. In particular, the seal 140, and the portions thereof, namely, the annular main seal body 142 which can be defined as the first or base portion 165 of the seal 140, and the second portion defined as the alloyed outer seal layer 166 of the seal 140, can be manufactured and formed via two distinct, separate processes (as well as the one or more steps of each), as further disclosed herein. In one embodiment, the base portion 165 of the seal 140 including the annular main seal body 142 can be formed or manufactured by the one or more steps of a first process, and the alloyed outer seal layer 166 of the seal 140 can be formed by the one or more steps of a second process, wherein the first process, or at least a portion thereof, can precede the second process.

In one embodiment, the first process by which the base portion 165 of the seal 140 is formed can include a metal additive manufacturing process to form the annular main seal body 142, as well as the base material 169 composition thereof. The metal additive manufacturing process can be embodied as or carried out by the application of one or more, or a combination of, metal additive manufacturing processes or process types, which can include a powder bed fusion process. Additionally, or alternatively, the metal additive manufacturing process can be embodied as or carried out by the application of one or more, or a combination of, metal additive manufacturing processes or process types, which can include selective laser sintering, direct metal laser sintering, fused deposition modeling, stereo lithography, digital light processing, fused filament fabrication, melted and extrusion modeling, laminated object manufacturing, electron beam melting, selective heat sintering and/or ink head 3D printing. In another embodiment, the first process by which the base portion 165 of the seal 140 is formed can include one of a forging and precision casting process to fabricate the annular main seal body 142 as formed from and composed of the base material 169, wherein the annular main seal body 142 may be fabricated by forging or by precision casting followed by machining operation so as to attain a desired size and shape of the annular main seal body 142 and/or base portion 165 of the seal 140.

Figure 4:
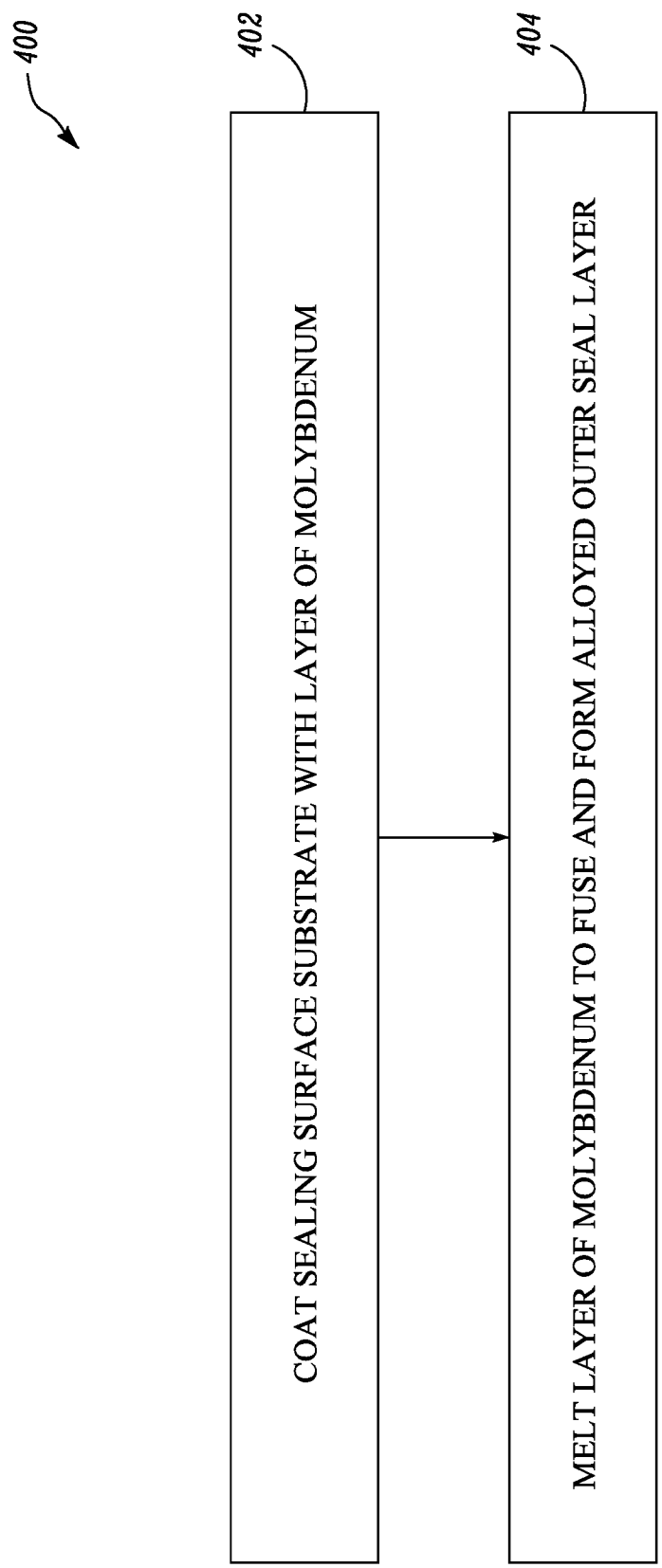
FIG. 4 is a flowchart illustrating an exemplary method for manufacturing the seal, in accordance with an aspect of the present disclosure.

FIGS. 2 and 3, in conjunction with FIG. 4, illustrate the one or more steps of the second process by which the second portion, defined as the alloyed outer seal layer 166 of the seal 140 can be formed, as well as the resultant features of the alloyed outer seal layer 166 and formed seal 140. FIG. 4 depicts an exemplary flowchart 400, which relates to a method of forming the alloyed outer seal layer 166 on a sealing surface substrate 146a of the seal 140 to thus form the sealing surface 146. This method is discussed in conjunction with FIGS. 2 and 3 and begins at step 402.

Following the formation of the annular main seal body 142 or base portion 165 of the seal 140 upon completion of the first process or alternatively, at least partial completion of the first process upon completion of the steps thereof resulting in the formation of the pre-formed sealing surface 146 at the sealing end 158 of the annular main seal body 142 or base portion 165 to which the process steps as disclosed herein are applied, defined herein as the sealing surface substrate 146a) according to any one or more of the embodiments as disclosed herein, the second process by which the alloyed outer seal layer 166 of the seal 140 can be formed begins at step 402. At step 402, the method of the second process includes the step of depositing or otherwise forming a layer of Molybdenum 148 upon the sealing end 158 of the annular main seal body 142 base portion 165, and base material 169 thereof, such that the layer of Molybdenum 148 coats the sealing surface substrate 146a, as illustrated in FIG. 3. The coating may be performed by a coating nozzle 170 or, alternatively, any other similar or suitable instrument which may be employed to perform the step of depositing and forming the coating of Molybdenum 148 onto the base material 169 of the sealing surface substrate 146a. In one embodiment, the coating of the layer of Molybdenum 148 may be performed by a high velocity oxygen fuel (HVOF) process or, alternatively, by a Physical Vapor Deposition (PVD) process.

The HVOF process may utilize a thermal spray system from a combustion of gases, such as of Hydrogen or of a liquid fuel such as kerosene, to generate a relatively high velocity stream of the coating material (i.e. Molybdenum) onto the pre-formed sealing surface 146 substrate (i.e. the sealing surface substrate 146a). By using the HVOF process, a relatively high coating density may be obtained.

The PVD process may involve a conversion of a material from a condensed phase to a vapor phase and then back to a thin film condensed phase on the pre-formed sealing surface 146 substrate (i.e. the sealing surface substrate 146a). Although these methods of coating are disclosed, other methods may also be applicable. For example, the coating may also be performed by an electrolytic and/or an airborne spray process.

At step 404, the method includes melting (i.e. effectively re-melting) the layer of Molybdenum 148 to fuse, impregnate, and/or blend the layer of Molybdenum 148 into the base material 169 of the annular main seal body 142, the sealing surface substrate 146a, and the base material 169 thereof to form the alloyed outer seal layer 166 and the outer sealing surface 146, as illustrated in FIG. 3. In particular, in one embodiment, the process of melting may be performed by a laser surface alloying process that utilizes high density power available from a focused laser 168 to melt the Molybdenum 148 coating layer applied to the sealing surface substrate 146a and the base material 169 at, and below, the sealing surface substrate 146a of the annular main seal body 142 seal 140, such than the layer of Molybdenum 148 is integrated with the base material 169 at (and just below) the sealing surface substrate 146a to thus form the alloyed outer seal layer 166 (as well as the outer, sealing surface 146 thereof) as composed of the alloyed material 171 which includes and is formed from the base material 169 of the sealing surface substrate 146a and Molybdenum as integrated therein from the Molybdenum 148 coating layer. In one implementation, the laser surface alloying process employs a Laser Beam Rastering process (see FIG. 3) to melt the layer of Molybdenum 148. In an embodiment, the laser 168 may provide high density power for melting the layer of Molybdenum 148 via the generation and application of a coherent, focused beam of light which may be applied to, and throughout, the entirety of the circumferential surface area of the sealing surface substrate 146a by traversing from the outer circumference 152 to the inner circumference 150 (see direction, A, FIG. 3) in periodic, back and forth steps to perform the melting operation across the sealing surface 146. In an alternative embodiment, the application of heat to the layer of Molybdenum 148 and resultant formation of the alloyed outer seal layer 166 and the outer sealing surface 146 as applied by the laser 168 as disclosed above may alternatively be performed by induction heating or by an electron beam welding process. The method ends at step 404.

INDUSTRIAL APPLICABILITY

The operating environment and operating conditions within which seals, including seal 140 of the present disclosure, may be utilized, may be characterized by the seals experiencing, in part, metal-to-metal contact for prolonged periods, which may result in increased frictional engagement between the seal and the surface which the seal engages, and may ultimately result in seal damage, seizure, and/or failure. During operation, the sealing surface 146 of the seal 140 may repeatedly engage and slide against a surface that the alloyed outer seal layer 166 of the sealing surface 146 contacts. For example, the sealing surface 146 may slide against a sealing surface of an adjoining seal, an end face of a bushing, etc. A resulting metal-to-metal contact for prolonged periods may increase friction, and thus generate heat from friction. In conventional machines, such a situation increases probability of seal seizure, seal damage, and inevitably, machine downtime.

According to the aspects of the present disclosure, applying (or coating) a layer of Molybdenum 148, and re-melting the layer of Molybdenum 148, thereby integrating the layer of Molybdenum 148 with the pre-formed sealing surface 146 substrate (i.e. with the base material 169 at the sealing surface substrate 146a of the seal 140), provides an alloyed outer seal layer 166 and sealing surface 146 with enhanced wear resistant properties. Moreover, a controllable surface alloy with increased hardness is obtained. Accordingly, there is reduced galling at the sealing surface 146, resulting in longer life of the seal 140, even under strenuous operational conditions. Furthermore, the alloyed outer seal layer 166, and the alloyed material 171 thereof (inclusive of Molybdenum) provides enhanced friction and reduced wear properties by having a relatively higher content of Molybdenum, which in this application is proposed to take a value between 10% to 20% of the total material applied in the alloyed outer seal layer 166.

In an embodiment, the method of forming the alloyed outer seal layer 166 on the sealing surface substrate 146a may include selectively nitriding a portion or a whole of the Molybdenum, as the layer of Molybdenum 148 is deposited on the sealing surface substrate 146a. An introduction of a selective blend of Nitrogen and Argon within a chamber where the sealing surface substrate 146a is being coated with the layer of Molybdenum 148 may allow portions of the Molybdenum to be nitrided, in turn increasing a hardness and a wear resistance of a finished, alloyed outer seal layer 166. Such selective nitriding may be performed in a predetermined pattern or randomly, and may be based on relative volume fractions of the gases that are added into the chamber.

It may be appreciated that the fused coating of the layer of Molybdenum 148 in the alloyed outer seal layer 166 may be further ground, lapped, polished and/or subjected to other finishing, processes in order to obtain the desired smoothness of a surface suitable for the wear surface (i.e. the sealing surface 146). Because the coating process disclosed in this application may be used to form a relatively thick coating of the alloyed outer seal layer 166, the resulting seal 140 is both wear-resistant and corrosion resistant. In one implementation, a hardness of the alloyed outer seal layer 166 may be up to Vickers Number (hv) 700, and a reduction in friction attained may be up to 50% of the friction of the base material 169.

It will be apparent to those skilled in the art that various modifications and variations can be made to the system of the present disclosure without departing from the scope of the disclosure. Other embodiments will be apparent to those skilled in the art from consideration of the specification and practice of the system disclosed herein. It is intended that the specification and examples be considered as exemplary only, with a true scope of the disclosure being indicated by the following claims and their equivalent.

What is claimed is:

1. A method for manufacturing a seal, the method comprising:
   providing an annular main seal body of the seal;
   coating a sealing surface substrate of the annular main seal body of the seal with a layer of Molybdenum; and
   melting the layer of Molybdenum to fuse the layer of Molybdenum into the sealing surface substrate to form an alloyed outer seal layer,
   wherein the alloyed outer seal layer forms a sealing surface of the seal,
   wherein the annular main seal body is made from one of C6 white iron, low carbon steel, C6 nickel alloy, stellite iron alloy, Ni-Hard iron alloy, SAE 52100 steel, or SAE 1074 steel,
   wherein a percentage of Molybdenum in the alloyed outer seal layer is between 10% to 20%, and
   wherein the annular main seal body with the alloyed outer seal layer has a same thickness as the provided annular main seal body.

2. The method of claim 1, wherein the alloyed outer seal layer has a thickness that ranges between 100 microns to 500 microns.

3. The method of claim 1, wherein the coating is performed by a High Velocity Oxygen Fuel (HVOF) process.

4. The method of claim 1, wherein the coating is performed by a Physical Vapor Deposition (PVD) process.

5. The method of claim 1, wherein melting is performed by a laser surface alloying process including Laser Beam Rastering.

6. The method of claim 1, wherein a hardness of the sealing surface formed by the alloyed outer seal layer is 700 Vickers Number (hv).

7. The method of claim 1, wherein said coating the sealing surface substrate with the layer of Molybdenum includes selectively nitriding the Molybdenum.

8. A seal manufactured by a process comprising:
   coating a sealing surface substrate of an annular main seal body of the seal with a layer of Molybdenum; and
   melting the layer of Molybdenum to fuse, impregnate, and blend the layer of Molybdenum into the sealing surface substrate to form an alloyed outer seal layer,
   wherein the alloyed outer seal layer forms a sealing surface of the seal,
   wherein the annular main seal body is made from one of C6 white iron, low carbon steel, C6 nickel alloy, stellite iron alloy, Ni-Hard iron alloy, SAE 52100 steel, or SAE 1074 steel, and
   wherein a percentage of Molybdenum in the alloyed outer seal layer is between 10% to 20%.

9. The seal of claim 8, wherein the alloyed outer seal layer has a thickness that ranges between 100 microns to 500 microns.

10. The seal of claim 8, wherein the coating is performed by a High Velocity Oxygen Fuel (HVOF) process.

11. The seal of claim 8, wherein the coating is performed by a Physical Vapor Deposition (PVD) process.

12. The seal of claim 8, wherein melting is performed by a laser surface alloying process including Laser Beam Rastering.

13. A seal comprising:
   a base portion made from a base material; and
   an alloyed outer seal layer formed from the base material and Molybdenum,
   wherein the alloyed outer seal layer forms a sealing surface of the seal,
   wherein the seal includes an annular main seal body, the annular main seal body is made from one of C6 white iron, low carbon steel, C6 nickel alloy, stellite iron alloy, Ni-Hard iron alloy, SAE 52100 steel, or SAE 1074 steel,
   wherein a percentage of Molybdenum in the alloyed outer seal layer is between 10% to 20%, and
   wherein the alloyed outer seal layer is comprised of the Molybdenum fused, impregnated, and blended into the base material.

14. The seal of claim 13, wherein the alloyed outer seal layer has a thickness that ranges between 100 microns to 500 microns.

15. The seal of claim 13, wherein the alloyed outer seal layer is formed by:
   coating a sealing surface substrate of an annular main seal body of the seal with a layer of Molybdenum; and
   melting the layer of Molybdenum to fuse the layer of Molybdenum into the sealing surface substrate to form the alloyed outer seal layer, wherein the alloyed outer seal layer forms the sealing surface of the seal.

16. The seal of claim 15, wherein the coating is performed by one of:
   a High Velocity Oxygen Fuel (HVOF) process, or
   a Physical Vapor Deposition (PVD) process.

* * * * *